(12) United States Patent
Nozaki et al.

(10) Patent No.: US 7,757,389 B2
(45) Date of Patent: Jul. 20, 2010

(54) METHOD OF MANUFACTURING AN ULTRASONIC PROBE

(75) Inventors: Mitsuhiro Nozaki, Phoenix, AZ (US); Hiroshi Isono, Tokyo (JP); Hiroshi Usui, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 319 days.

(21) Appl. No.: 11/767,664

(22) Filed: Jun. 25, 2007

(65) Prior Publication Data

US 2008/0002375 A1  Jan. 3, 2008

(30) Foreign Application Priority Data

Jun. 28, 2006  (JP) .............................. 2006-178705

(51) Int. Cl.
*H05K 3/00* (2006.01)
(52) U.S. Cl. .............................. 29/829; 29/594; 29/831; 29/832; 29/846; 428/212; 428/216; 428/336; 428/426; 428/428; 361/749; 438/455; 438/457; 438/459; 438/745; 438/753
(58) Field of Classification Search ................ 29/592.1, 29/602.1, 829, 831, 832, 846; 428/212, 216, 428/336, 426, 428, 432; 361/749; 438/455–459, 438/695, 745, 753
See application file for complete search history.

(56) References Cited

U.S. PATENT DOCUMENTS 4,309,075 A * 1/1982 Apfel et al. .................. 359/586
4,704,774 A 11/1987 Fujii et al.
4,734,963 A 4/1988 Ishiyama
5,296,777 A 3/1994 Mine et al.
5,667,700 A * 9/1997 Rudigier et al. ............... 216/12
5,711,058 A 1/1998 Frey
5,735,282 A 4/1998 Hossack
6,044,533 A 4/2000 Bureau et al.
6,049,958 A 4/2000 Eberle et al.
6,129,866 A * 10/2000 Hamanaka et al. ........... 264/1.7
6,618,916 B1 9/2003 Eberle et al.
2008/0106976 A1 5/2008 Davidsen et al.

FOREIGN PATENT DOCUMENTS

| JP | 61161446 A | 7/1986 |
| JP | 63146699 | 6/1988 |
| JP | 04166139 | 6/1992 |
| JP | 10512680 | 12/1998 |
| JP | 2002-330963 | 11/2002 |
| JP | 2006-020297 | 1/2006 |
| JP | 2008526343 | 7/2008 |

* cited by examiner

*Primary Examiner*—Paul D Kim
(74) *Attorney, Agent, or Firm*—Armstrong Teasdale LLP

(57) ABSTRACT

For providing a flexible printed circuit board in which the distance between each of plural wiring patterns is a desired distance by cutting the flexible printed circuit board having plural wiring patterns, plural wiring patterns are formed so as to extend on the surface of an electrically insulative base film, and each of the plural wiring patterns is formed so as to include a portion where the distance between each of them is narrowed along the extending direction of the base film.

12 Claims, 4 Drawing Sheets

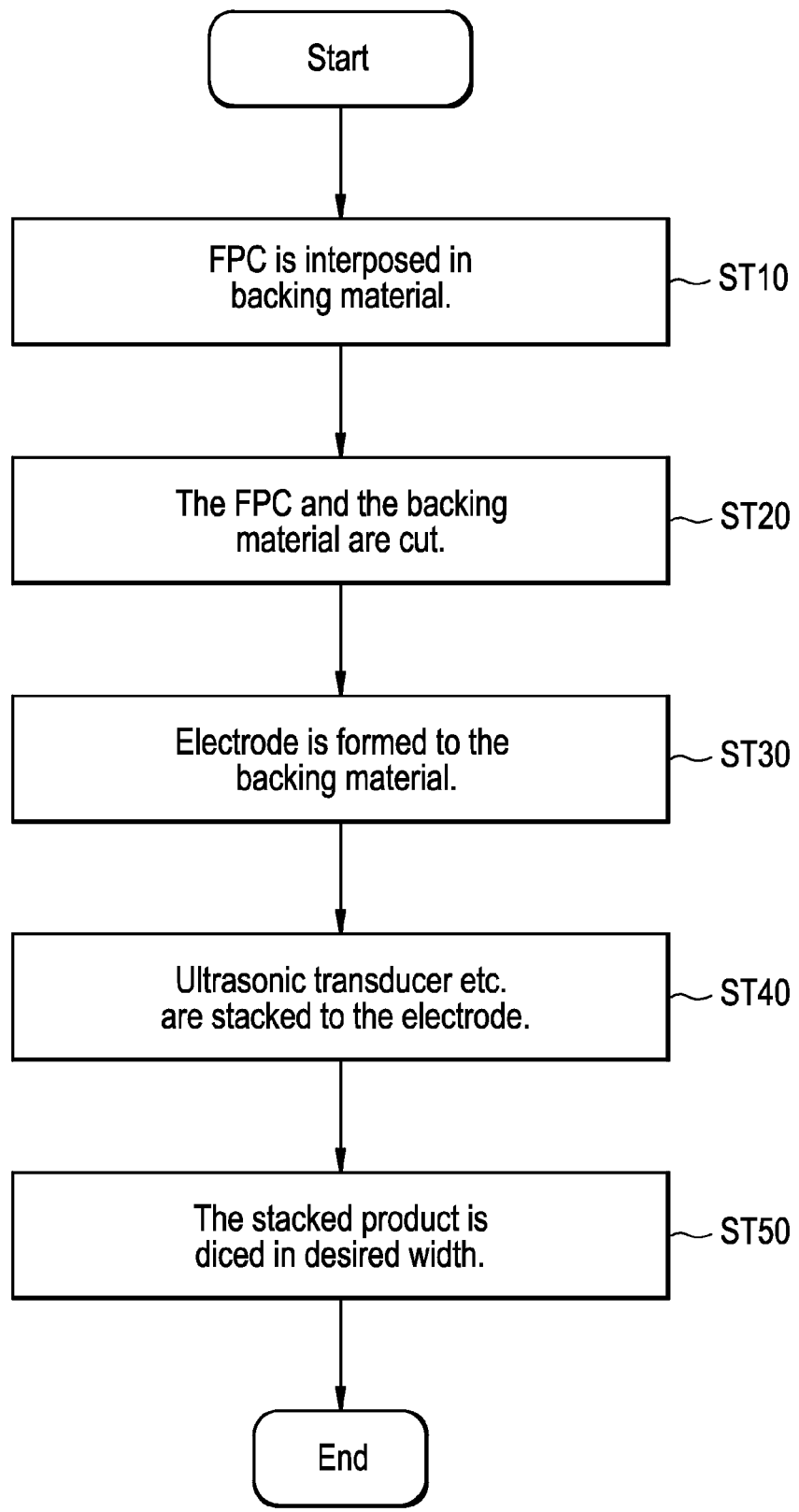

METHOD OF MANUFACTURING AN ULTRASONIC PROBE

CROSS REFERENCE TO RELATED APPLICATIONS

This application claims the benefit of Japanese Patent Application No. 2006-178705 filed Jun. 28, 2006.

BACKGROUND OF THE INVENTION

The present invention relates to a flexible printed circuit board, an ultrasonic probe, and a method of manufacturing an ultrasonic probe.

A flexible printed circuit board (hereinafter referred to as FPC) has been used as internal wirings and part mounting substrates for equipment along with progress in the reduction of size, weight, and thickness of electronic equipment. In FPCs, complicate circuits are formed on a flexible electrically insulative film and since they can be flexed, stacked, folded, twisted, etc., they can effectively utilize the space or enable stereoscopic wirings, and are used, for example, in video cameras, car stereo systems, personal computers and printer heads.

Further, FPCs have been used also in the field of medical equipment. For example, in an ultrasonic probe for transmitting and receiving ultrasonic waves in ultrasonic diagnosis equipment, wiring patterns in FPC are connected with ultrasonic transducers and used. By the use of FPC, space can be saved and stereoscopic wiring is possible in the same manner as described above. Particularly, it is suitable to use in a curved array in which ultrasonic transducers are arranged on a curved surface.

By the way, in ultrasonic waves used in the ultrasonic diagnosis equipment, an optimal frequency is different depending on the diagnosis portion of an object to be inspected. Further, the frequency of ultrasonic waves that can be transmitted generally becomes higher as the size of the ultrasonic transducer decreases. Accordingly, the frequency of the ultrasonic waves transmitted from the ultrasonic transducer is different depending on the width of the ultrasonic transducer. Therefore, ultrasonic transducers of various width are necessary in the ultrasonic probe. For example, the size of an ultrasonic transducer is about from 0.2 to 0.6 mm (refer, for example, to Patent Document 1).

Plural wiring patterns in FPC used for an ultrasonic probe are formed in parallel with each other. Accordingly, it was necessary for forming plural wiring patterns to a base film conforming the distance between each of plural ultrasonic transducers (refer, for example, to Patent Document 2).

[Patent Document 1] JP-A No. 2002-330963

[Patent Document 2] JP-A No. 2006-20297

In the case of using an FPC to an ultrasonic probe, plural wiring patterns in the FPC are connected with plural ultrasonic transducers. Accordingly, it is necessary to form plural wiring patterns to a base film in accordance with the width of plural ultrasonic transducers. However, manufacture of FPC in accordance with the width of the ultrasonic probe requires much labor and cost.

SUMMARY OF THE INVENTION

Therefore, it is an object of the present invention to provide a flexible printed circuit board in which the distance between each of plural wiring patterns forms a desired distance by cutting a flexible printed circuit board having plural wiring patterns, a method of manufacturing an ultrasonic probe using the flexible printed circuit board, as well as an ultrasonic probe manufactured by the manufacturing method described above.

For attaining the foregoing object, a flexible printed circuit board of the invention is a flexible printed circuit board in which plural wiring patterns are formed so as to extend on the surface of an electrically insulative substrate, wherein each of the plural wiring patterns includes a portion in which a distance between each other is narrowed along the extending direction of the substrate.

For attaining the foregoing object, a method of manufacturing the ultrasonic probe of the invention is a method of manufacturing an ultrasonic probe having plural arranged ultrasonic transducers and, a flexible printed circuit board in which plural wiring patterns to be connected with the plural ultrasonic transducers are arranged on the surface of an electrically insulative substrate being spaced along the arranging direction of the plural ultrasonic transducers, the method including a cutting step for cutting the flexible printed circuit board, wherein: the flexible printed circuit board used in the cutting step including a portion in which the substrate extending in the direction different from the direction of arranging the ultrasonic transducer and the plural wiring patterns extend such that the distance between each of the plural wiring patterns is narrowed along the extending direction of the substrate, and the flexible printed circuit board is cut in the cutting step such that, the arranging positions for the plural ultrasonic transducers and the positions for the plural wiring patterns in the flexible printed circuit board correspond to each other.

For attaining the foregoing object, the ultrasonic probe of the invention is an ultrasonic probe having: plural arranged ultrasonic transducers; and a flexible printed circuit board in which plural wiring patterns to be connected with the plural ultrasonic transducers are arranged on a surface of an electrically insulative substrate being spaced along the arranging direction of the plural ultrasonic transducers, wherein: the flexible printed circuit board includes a portion in which the substrate extends in the direction different from the direction of arranging the ultrasonic transducers and the plural wiring patterns extend such that the distance between each of the plural wiring patterns is narrowed along the extending direction of the substrate; and the ultrasonic probe is manufactured by cutting the flexible printed circuit board such that the arranging positions for the plural ultrasonic transducers and the positions for the plural wiring patterns in the flexible printed circuit board correspond to each other.

According to the invention, it is possible to provide a flexible printed circuit board in which the distance between plural wiring patterns provides a desired distance by cutting the flexible printed circuit board having plural wiring patterns, a method of manufacturing an ultrasonic probe using the flexible printed circuit board, and an ultrasonic probe manufactured by the manufacturing method.

Further objects and advantages of the present invention will be apparent from the following description of the preferred embodiments of the invention as illustrated in the accompanying drawings.

BRIEF DESCRIPTION OF THE DRAWINGS

FIG. 3 is a flow chart for the method of manufacturing an ultrasonic probe using a flexible printed circuit board in an embodiment of the invention.

FIGS. 4(a) and 4(b) are views showing a mark formed on the surface of a flexible printed circuit board along the extension direction of a flexible printed circuit board of the invention, in which FIG. 4(a) is a view showing a scale indicative of the length of the flexible printed circuit board formed along the extending direction of the flexible printed circuit board in the third embodiment of the invention and FIG. 4(b) is a view indicative of a wiring pattern for recognizing the length of the printed circuit board in the extending direction based on the measured resistance value in the fourth embodiment of the invention.

DETAILED DESCRIPTION OF THE INVENTION

Preferred embodiments according to the present invention are to be described with reference to the drawings.

First Embodiment

Figure 1A:
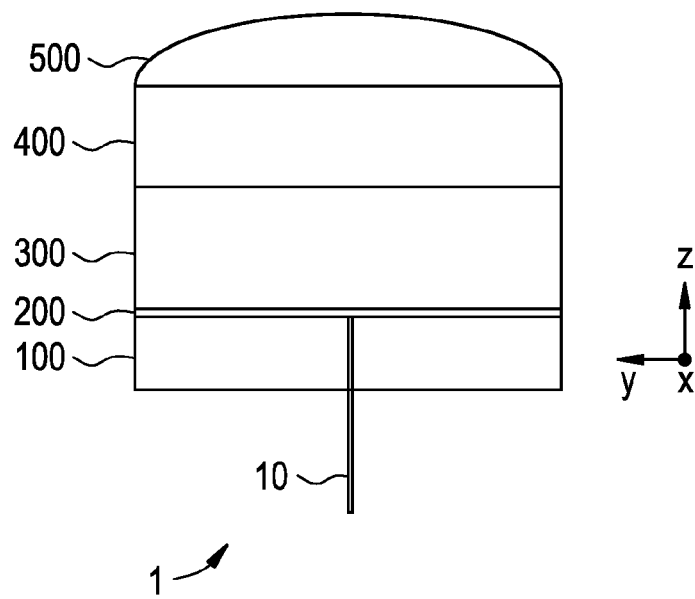
FIGS. 1(*a*) and 1(*b*) are schematic views of an ultrasonic probe 1 manufactured by using a flexible printed circuit board in an embodiment of this invention.
Figure 1B:
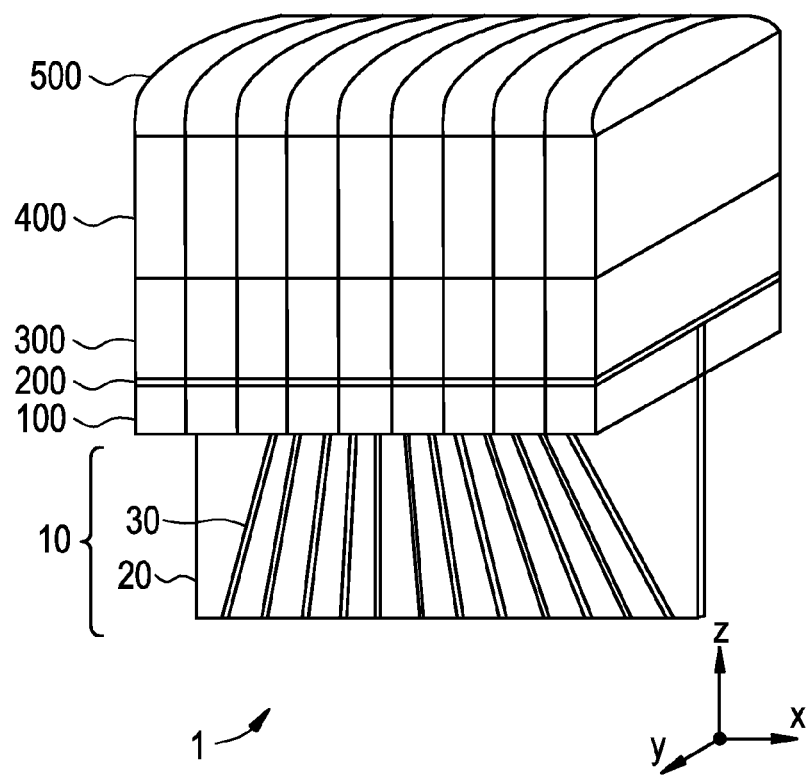

FIGS. 1(a) and 1(b) are schematic views of an ultrasonic probe manufactured by using a flexible printed circuit board in an embodiment according to the invention. FIG. 1(a) is a front elevational view and FIG. 1(b) is a perspective view.

Figure 2A:
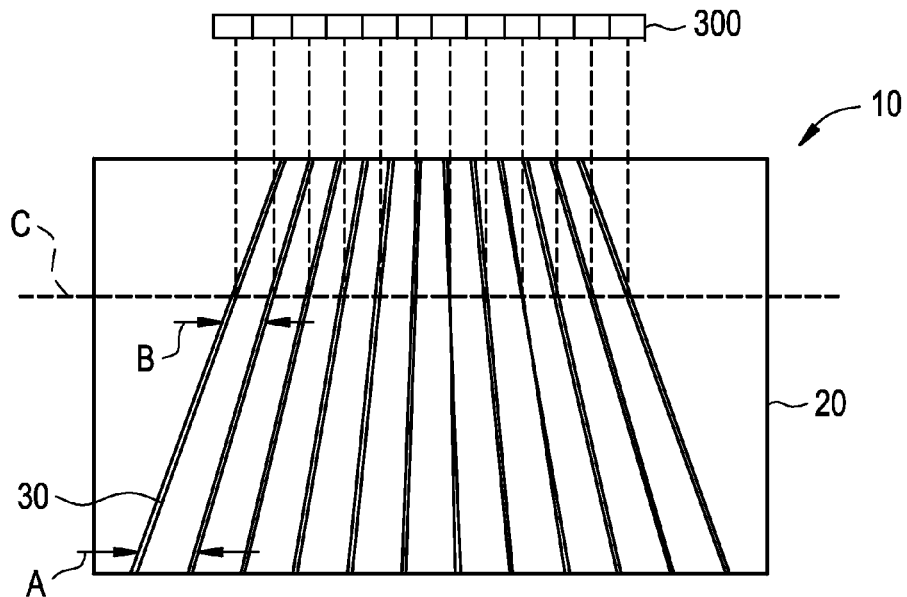
FIGS. 2(*a*) and 2(*b*) are views showing a wiring pattern shape of a flexible printed circuit board of the invention, in which FIG. 2(*a*) is a view showing a flexible printed circuit board in the first embodiment of the invention
FIG. 2(b) is a view showing a flexible printed circuit board in a second embodiment of the invention.
Figure 2B:
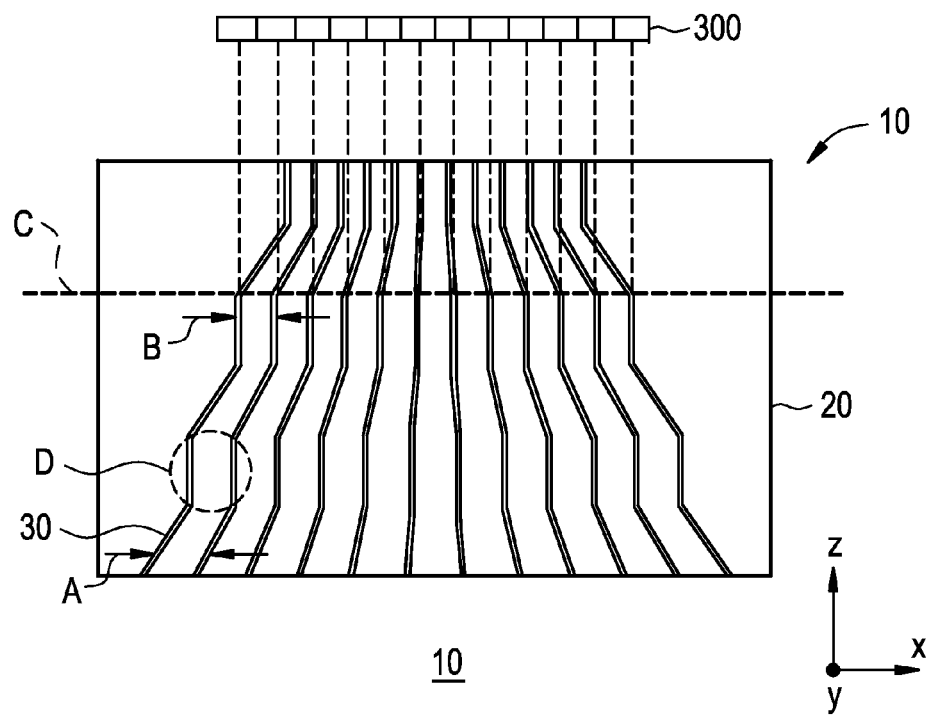

FIGS. 2(a) and 2(b) are views showing a wiring pattern in the flexible printed circuit board according to the invention. FIG. 2(a) is a view showing the flexible printed circuit board in a first embodiment of the invention. A, B in FIG. 2(a) are respective distances of the plural wiring patterns 30. Further, the position C is a position at which the positions for the plural wiring patterns 30 are aligned with arranged positions for the plural ultrasonic transducers 300.

Each of the constituent elements is to be described successively.

As shown in FIG. 1(a) an ultrasonic probe 1 in the first embodiment of the invention has an FPC 10, a backing material 100, a solid electrode 200, an ultrasonic transducer 300, a matching layer 400, an acoustic lens 500 and a cover (not illustrated). Further, as shown in FIG. 2(a), the FPC 10 has a base film 20 and wiring patterns 30.

The base film 20 is an electrically insulative film as a base for the FPC 10.

The base film 20 is formed, for example, of an electrically insulative film having a flexibility such as of polyester, polyvinyl chloride, polyamide, polyimide, or like other type. An adhesive insulative layer having a flexibility such as of epoxy, urethane, polyacrylonitrile, polyester, or like other type is disposed to the base film 20, and the wiring pattern 30 is formed of a highly electroconductive metal such as copper or aluminum on the adhesive insulative layer. A flexible electrically insulative film is laminated thereon for preventing short circuit between the wiring patterns 30, and between the wiring pattern 30 and other member.

Wiring pattern 30 is formed so as to extend on the surface of the base film 20. The wiring pattern 30 is formed, for example, of a highly electroconductive metal such as copper or aluminum.

Further, the wiring pattern 30 is formed on the base film, for example, by a subtraction method or an additive method.

The subtraction method is a method of bonding a metal foil such as of copper or aluminum with an adhesive on the surface of the base film 20 and removing unnecessary portion while leaving the wiring pattern 30. The additive method is a method of forming a wiring pattern 30 on the surface of the base film 20.

As shown in FIG. 2(a), the wiring patterns 30 in the first embodiment of the invention are formed such that the distances between each of the plural wiring patterns 30 is narrowed continuously along the extending direction of the FPC 10. For example, as shown in FIG. 2(a), the distance A is narrowed continuously, to be a distance B. Accordingly, by cutting the FPC 10 at a position where the arranged positions for the plural ultrasonic transducers 300 and the positions for the plural wiring patterns 30 on the FPC 10 are aligned with each other, an FPC 10 in which the positions for the plural wiring pattern 30 at the end face of the FPC 10 are aligned with the arranged positions for the plural ultrasonic transducers 300 can be obtained.

The backing material 100 is disposed at the back of the solid electrode 200. The backing material 100 suppresses the free vibrations of the ultrasonic transducer 300 after sending the ultrasonic waves by oscillating the ultrasonic transducer 300. This can shorten the pulse width of the ultrasonic wave. Further, the backing material 100 suppresses unnecessary propagation of ultrasonic waves rearward of the backing material.

As the backing material 100, those material causing large ultrasonic attenuation are used and, for example, they include an epoxy resin and a rubber with addition of a tungsten powder, or the like. Further, the acoustic impedance of the backing material 100 in the invention is preferably from $2 \times 10^5$ g/(cm$^2 \cdot$sec) to $10 \times 10^5$ g/(cm$^2 \cdot$sec).

The solid electrode 200 is disposed between the ultrasonic transducer 300 and the backing material 100 over the entire surface. The solid electrode 200 is formed by a method, for example, of plating, sputtering or vapor deposition. The solid electrode 200 is formed, for example, of a highly electroconductive metal such as gold, silver, or copper.

The ultrasonic transducer 300 comprises a piezoelectric material such as PZT (lead titanate zirconate) ceramics. By applying a voltage to the ultrasonic transducer 300 to oscillate the same, ultrasonic waves are transmitted from the ultrasonic transducer 300 to an object to be inspected (not illustrated) and reflected ultrasonic waves are received.

The matching layer 400 has an acoustic impedance intermediate the object to be inspected and the ultrasonic transducer 300, and suppresses reflection of ultrasonic waves due to the difference of the acoustic impedance between the object to be inspected and the ultrasonic transducer 300.

The acoustic lens 500 sets the focal point of the ultrasonic waves transmitted to the object to be inspected by utilizing the refraction of the ultrasonic was.

As shown in FIG. 1, in the ultrasonic probe 1, the solid electrode 200 is laminated to the frontal surface of the backing material 100 that has the FPC 10 interposed therein (surface where the PFC 10 does not extend). Then, the ultrasonic transducer 300, the matching layer 400, and the acoustic lens 100 are successively stacked to the frontal surface of the solid electrode 200 (surface not in contact with the backing material 100).

A method of manufacturing the ultrasonic probe 1 in the first embodiment of the invention is to be described.

FIG. 3 is a flow chart for a method of manufacturing an ultrasonic probe by using a flexible printed circuit board in the embodiment of the invention.

At first, the FPC 10 is interposed in the backing material 100 (ST10).

The FPC 10 is interposed in the backing material 100 so as to include the position for the wiring patterns 30 where the arranged positions for the plural ultrasonic transducers 300 and the positions for the plural wiring patterns 30 in the FPC 10 are aligned. A non-electroconductive adhesive is used for bonding the backing material 100 and the FPC 10.

Then, the FPC 10 and the backing material 100 are cut (ST20).

The FPC 10 and the backing material 100 are cut such that the positions for the plural wiring patterns 30 at the end face of the FPC 10 are aligned with the arranged positions for the plural ultrasonic transducers 30. By cutting after interposing the FPC 10 in the backing material 100, the backing material 100 and the FPC 10 can easily be in flush at the cut surface. By making them in flush, the solid electrode 200 can be easily formed at step ST30.

Upon cutting the FPC 10 and the backing material 100, the distance between each of the plural wiring patterns 30 at the position C (refer to FIG. 2(a)) where the positions for the plural wiring patterns 30 and the arranged positions for the plural ultrasonic transducers 300 are aligned is previously measured. Then, while measuring the distance between each of the plural wiring patterns 30, the FPC 10 is cut such that the distance between each of the plural wiring patterns 30 is equal with the distance between each of the plural wiring patterns 30 at the position C.

Further, in the method of manufacturing the ultrasonic probe 1 in the first embodiment of the invention, the sequence of the step ST10 and the step ST20 may be reversed. That is, after cutting the FPC 10 such that the distance between each of the plural wiring patterns 30 provides a desired distance, the FPC 10 may be interposed in the backing material 100.

Then, the solid electrode 200 is formed to the backing material 100 (ST30).

The solid electrode 200 is formed to the frontal surface of the backing material 100 (surface where the FPC 10 and the backing material 100 flush with each other). The solid electrode 200 is formed over the entire surface of the backing material by the method such as plating, sputtering, or vapor deposition. At step ST20, since the backing material and the FPC 10 flush with each other, the solid electrode 200 can be formed easily.

Then, the ultrasonic transducer 300, etc. are stacked to the solid electrode 200 (ST40).

The ultrasonic transducer 300, the matching layer 400, and the acoustic lens 500 are stacked successively to the frontal surface of the solid electrode 200 (surface not joined with the backing material 100). An electroconductive adhesive is used for bonding the solid electrode 200 and the ultrasonic transducer 300. Further, a non-electroconductive adhesive is used for the bonding between the ultrasonic transducer 300 and the matching layer 40 and for the bonding between the matching layer 400 and the acoustic lens 500.

Then, the stacked product is diced (ST50).

The product stacked at the step ST40 is diced by a dicing device so that the ultrasonic transducer 300 has a desired width. Dicing is conducted to such a depth that the solid electrode 200 is separated reliably.

As described above, in this embodiment, the FPC 10 is at first interposed in the backing material 100 using the adhesive. Then, the backing material 100 having the FPC 10 interposed therein is cut such that the distance between each of the plural wiring patterns 30 is at a desired distance. Then, the solid electrode 200 is formed by a method such as sputtering to the frontal surface of the backing material 100 (surface where the FPC 10 and the backing material 100 flush with each other). Then, the ultrasonic transducer 300, the matching layer 400, and the acoustic lens 500 are successively stacked to the frontal surface of the solid electrode 200 (surface not joined with the backing material 100) by using an adhesive. Then, the stacked product is diced by a dicing device such that the ultrasonic transducer 300 has a desired width.

According to the steps described above using the FPC 10 in the first embodiment of the invention, by cutting the FPC 10 at the position C where the arranged positions for the plural ultrasonic transducers 300 and positions for the plural wiring patterns 300 in the FPC 10 are aligned, an FPC 10 in which the positions for the plural wiring patterns 30 at the end face of the FPC 10 are aligned with the arranged positions for the plural ultrasonic transducers 300 can be obtained without forming the plural wiring patterns 30 to the base film 20 conforming the width of the ultrasonic transducer 300 in the ultrasonic probe 1 to be manufactured. Accordingly, the ultrasonic probe 1 can be manufactured efficiently while reducing the cost.

Second Embodiment

FIG. 2(b) is a view showing a flexible printed circuit board in a second embodiment of the invention. A and B in FIG. 2(b) show respective distances for plural wiring patterns 30. Further, the position C is a position where the positions for the plural wiring patterns 30 are aligned with the arranged positions for the plural ultrasonic transducers 300. Further, D is a portion where the distance between each of the plural wiring patterns does not change. The second embodiment is identical with the first embodiment except for the shape of the plural wiring patterns 30 in the FPC 10. Accordingly, descriptions are omitted for the duplicate portions.

An FPC 10 in the second embodiment of the invention is to be described with reference to the drawings.

As shown in FIG. 2(b), plural wiring patterns 30 in the second embodiment of the invention are formed such that the distance between each of the plural wiring patterns 30 is narrowed stepwise along the extending direction of the FPC 10. For example, as shown in FIG. 2(b), the distance A is narrowed stepwise to be a distance B. Accordingly, by cutting the FPC 10 at the position C where the arranged positions for the plural ultrasonic transducers 300 and the positions for the plural wiring pattern 30 are aligned, an FPC 10 in which the position for the plural wiring patterns 30 at the end face of the FPC 10 are aligned with the arranged positions for the plural ultrasonic transducers 300 can be obtained.

A method of manufacturing the ultrasonic probe 1 in the second embodiment of the invention is to be described. The method of manufacturing the ultrasonic probe 1 in the second embodiment is identical with the first embodiment except for step ST20 for cutting the FPC 10. Accordingly, descriptions are to be omitted for duplicate portions.

The FPC 10 and the backing material 100 are cut (ST20).

The FPC 10 and the backing material 100 are cut such that the positions for the plural wiring patterns 30 at the end face of the FPC 10 are aligned with the arranged positions for the plural ultrasonic transducers 30. By cutting after interposing the FPC 10 in the backing material 100, the backing material 100 and the FPC 10 can easily be in flush at the cut surface.

Upon cutting the FPC 10 and the backing material 100, distance between each of the plural wiring patterns 30 is previously measured at the position C where the position for the plural wiring patterns 30 and the arranged positions for the ultrasonic transducers 300 are aligned. Then, while measuring the distance for each of the plural wiring patterns 30 at the end face of the FPC 10, the FPC 10 is cut such that the distance between each of the plural wiring patterns 30 is equal with the distance between each of the plural wiring patterns 30 at the position C.

Further, by disposing the distance between each of the plural wiring patterns 30 which are used at a high frequency to the portion D in FIG. 2(b) where the distance between each of the plural wirings patterns 30 does not change, no subtle adjustment is necessary for obtaining a desired distance. Accordingly, a desired distance can be obtained easily.

As described above using the FPC 10 in the second embodiment of the invention, like in the first embodiment, by cutting the FPC 10 at the position C where the arranged positions for the plural ultrasonic transducers 300 and positions for the plural wiring patterns 300 in the FPC 10 are aligned, an FPC 10 in which the positions for the plural wiring patterns 30 at the end face of the FPC 10 are aligned with the arranged positions for the plural ultrasonic transducers 300 can be obtained without forming the plural wiring patterns 30 to the base film 20 conforming the width of the ultrasonic transducer 300 in the ultrasonic probe 1 to be manufactured. Accordingly, the ultrasonic probe 1 can be manufactured efficiently while reducing the cost.

Third Embodiment

Figure 4A:
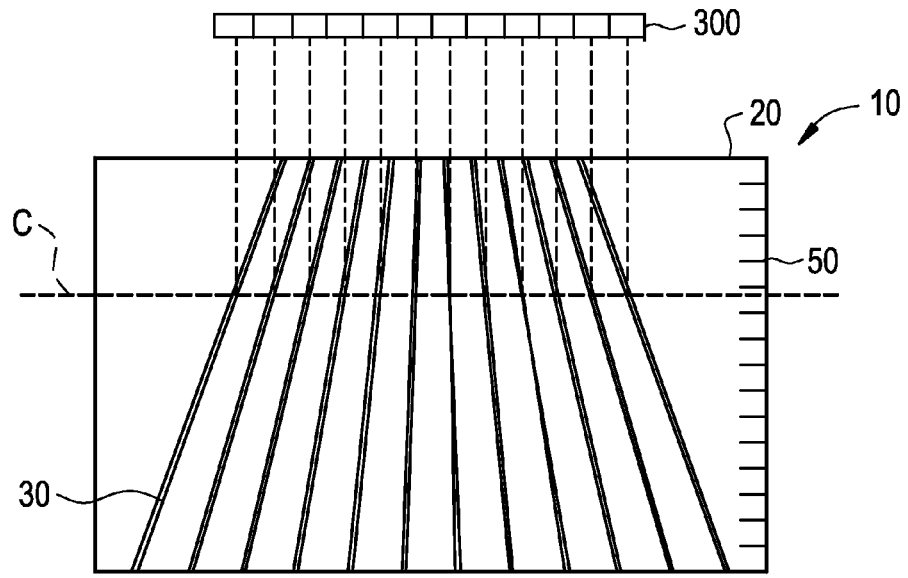
Figure 4B:
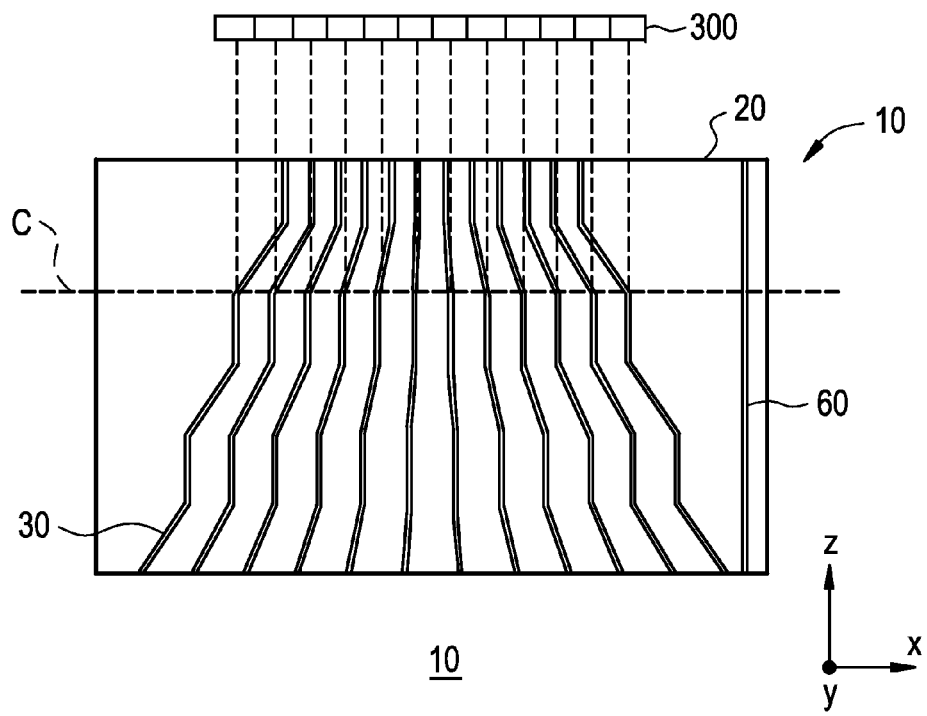

FIGS. 4(a) and 4(b) are views showing a mark formed on the surface of a flexible printed circuit board along the extending direction of the flexible printed circuit board of the invention. The mark is, for example, a scale indicative of the length in the extending direction of the FPC 10, a numerical showing the distance between each of the plural wiring patterns 30, or a wiring pattern for measuring the resistance value for recognizing the length in the extending direction of the FPC 10.

FIG. 4(a) is a view showing a scale indicative of a length of a flexible printed circuit board formed along the extending direction of the flexible printed circuit board in the third embodiment of the invention. The position C in FIG. 4(a) is a position where the positions for the plural wiring patterns 30 are aligned with the arranged positions for the plural ultrasonic transducers 300.

As shown in FIG. 4(a), the FPC 10 in the third embodiment has a base film 20, wiring patterns 30 and a scale 50. The third embodiment has an identical constitution with the first embodiment except for the scale 50 formed to the FPC 10. Accordingly, descriptions are to be omitted for the duplicate portions.

The FPC 10 in the third embodiment of the invention is to be described with reference to the drawings.

The scale 50 formed at the end on the surface of the FPC 10. The scale 50 is indicative of the length in the extending direction of the FPC 10. Further, the length in the extending direction of the FPC 10 corresponds to the distance between each of the plural wiring patterns 30. Accordingly, by cutting the FPC 10 in accordance with the scale 50, an FPC 10 in which the distance between each of the plural wiring patterns 30 is a desired distance can be obtained.

A method of manufacturing an ultrasonic probe 1 in the third embodiment of the invention is to be described. The method of manufacturing the ultrasonic probe 1 in the third embodiment is identical with the first embodiment except for step ST20 for cutting the FPC 10. Accordingly, descriptions are to be omitted for duplicate portions.

The FPC 10 and the backing material 100 are cut (ST20).

The FPC 10 and the backing material 100 are cut such that the positions for the plural wiring patterns 30 at the end face of the FPC 10 are aligned with the arranged positions for the plural ultrasonic transducers 30. By cutting after interposing the FPC 10 in the backing material 100, the backing material 100 and the FPC 10 can easily be in flush at the cut surface.

Upon cutting the FPC 10 and the backing material 100, the FPC 10 may be cut while measuring the distance between each of the plural wiring patterns 30 at the end face of the FPC 10, but even in a case where measurement is difficult by the effect of the backing material, the FPC 10 can be cut in accordance with the scale formed at the end of the surface of the FPC 10 along the extending direction of the FPC 10. In this case, the length in the extending direction of the FPC 10 corresponds to the distance for each of the plural wiring patterns 30. Accordingly, a reference table for the distance of the wiring patterns 30 and the scale 50 is prepared previously. Then, by reading the value of a scale 50 corresponding to the distance of a desired wiring pattern 30 from the reference table and cutting the FPC 10 at the position for the value read from the reference table at the scale 50, the FPC 10 can be cut at a position where the arranged positions for the plural ultrasonic transducers 300 and the positions for the plural wiring patterns 30 at the FPC 10 shown in FIG. 4(a) are aligned.

As described above, by using the FPC 10 in the third embodiment of the invention, the ultrasonic probe 1 can be manufactured efficiently while reducing the cost, in the same manner as in the first embodiment, even without forming the plural wiring patterns 30 to the base film 20 conforming the width of the ultrasonic transducers 300 in the ultrasonic probe 1 to be manufactured.

Fourth Embodiment

FIG. 4(b) is a view showing a wiring pattern of a further embodiment of the invention for recognizing the length of the flexible printed circuit board in the extending direction based on the measured resistance value. C in FIG. 4(b) is a position where the positions for the plural wiring patterns 30 are aligned with the arranged positions for the plural ultrasonic transducers 300.

As shown in FIG. 4(b), the FPC 10 in the fourth embodiment has a base film 20, a wiring pattern 30 and a wiring pattern 60 for measuring the resistance value. The constitution of the fourth embodiment is identical with that of the second embodiment except for the wiring pattern 60 for measuring the resistance value. Accordingly, descriptions are to be omitted for duplicate portions.

The wiring pattern 60 for measuring the resistance value is formed so as to extend on the surface of the FPC 10. The wiring pattern 60 for measuring the resistance value is identical with the wiring pattern 30 in view of the material to be used and the method of formation.

The resistance value (Q) is generally represented by the following equation (1), wherein ρ is resistivity (Ω·m), l is indicative of length (m), and S is indicative of cross sectional view (m²).

(Equation 1)

$$R = \rho \times l / S \tag{1}$$

According to the equation (1), the resistance value R is in proportion with the length l.

Accordingly, by measuring the resistance value of the wiring pattern 60, the length of the FPC 10 in the extending direction can be recognized in the same manner as in the case of the scale 50.

Accordingly, like in the third embodiment, by cutting the FPC 10 in accordance with the resistance value of the wiring pattern 60 for measuring the resistance value, an FPC 10 in which the distance between each of the plural wiring patterns 30 is a desired distance can be obtained. By measuring the resistance value of the wiring pattern 30, the same effect as described above can be obtained even with no additional provision of the wiring pattern 60 for measuring the resistance value.

A method of manufacturing an ultrasonic probe 1 in the fourth embodiment of the invention is to be described. The method of manufacturing the ultrasonic probe 1 in the fourth embodiment is identical with the first embodiment except for step ST20 for cutting the FPC 10. Accordingly, descriptions are to be omitted for duplicate portions.

The FPC 10 and the backing material 100 are cut (ST20).

The FPC 10 and the backing material 100 are cut such that the positions for the plural wiring patterns 30 at the end face of the FPC 10 are aligned with the arranged positions of the plural ultrasonic transducers 300. By cutting after interposing the FPC 10 in the backing material 100, the backing material 100 and the FPC 10 can easily be in flush at the cut surface. The solid electrode 200 can be formed easily at step ST30 by making them in flush.

Upon cutting the FPC 10 and the backing material 100, the FPC 10 may be cut while measuring the distance between each of the plural wiring patterns 30 at the end face of the FPC 10 but, even in a case where the measurement is difficult by the effect of the backing material 100, the resistance value of the wiring pattern 60 for measuring the resistance value formed to the FPC 10 along the extending direction of the FPC 10 may be measured and the FPC 10 can be cut in accordance with the resistance value.

Generally, since the resistance value is in proportion with the length, the length of the FPC 10 can be recognized by measuring the resistance value of the wiring pattern 60 for measuring the resistance value. Further, the length of the FPC 10 in the extending direction corresponds to the distance between each of the plural wiring patterns 30. Accordingly, a reference table between the distance for the plural wiring patterns 30 and the resistance value of the wiring pattern 60 for measuring the resistance value is previously prepared, for example, and the resistance value of the wiring pattern 60 for measuring the resistance value corresponding to the distance of the desired wiring pattern 30 is read from the reference table. Then, by putting terminals of the resistance measurement instrument against both ends of the wiring pattern 60 for measuring the resistance value, the resistance value between both ends of the wiring pattern 60 for measuring the resistance value is measured and by cutting the FPC 10 till it reaches the read resistance value, an FPC 10 in which the positions for the plural wiring patterns 30 at the end face of the FPC 10 are aligned with the arranged positions for the plural ultrasonic transducers 300 can be obtained.

As described above, by using the FPC 10 in the fourth embodiment of the invention, an ultrasonic probe 1 can be manufactured efficiently while reducing the cost in the same manner as in the first embodiment even without forming the plural wiring patterns 30 to the base film 20 conforming the width of the ultrasonic transducers 300 in the ultrasonic probe 1 to be manufactured.

The ultrasonic probe 1 in this embodiment corresponds to the ultrasonic probe of the invention. The flexible printed circuit board 10 of this embodiment corresponds to the flexible printed circuit board of the invention. Further, the base film 20 in this embodiment corresponds to the electrically insulative substrate according to the invention. Further, the scale 50 of this embodiment corresponds to the scale of the invention. Further, the wiring pattern 60 for measuring the resistance value of the embodiment corresponds to the wiring pattern of the invention. Further, the backing material 100 of the embodiment corresponds to the backing material of the invention. Further, the ultrasonic transducer 300 of the embodiment corresponds to the ultrasonic transducer of the invention.

Upon practicing the invention, it is not restricted to the embodiments described above but various modified embodiments can be adopted.

In the embodiment of the invention, while the FPC 10 is used for the manufacture of the ultrasonic probe 1, this is not restrictive but can be used also to the manufacture of electronic equipment requiring various distance of the wiring pattern in the FPC depending on the type of parts.

In the method of manufacturing the ultrasonic probe 1 in the embodiment of the invention, the FPC 10 is interposed in the backing material 100, the FPC 10 and the backing material 100 are cut and then the solid electrode 200 is formed to the backing material 100, and the ultrasonic transducer 300 is stacked on the solid electrode 200 but this is not restrictive and, for example, the FPC 10 may be cut, the FPC 10 is bonded directly to the ultrasonic transducer 300 and the FPC 10 may be interposed between the ultrasonic transducer 300 and the backing material 100.

In the method of manufacturing the ultrasonic transducer 1 in the embodiment of the invention, while the FPC 10 used for step 2 is the FPC 10 in the third embodiment, this is not restrictive but the FPC 10 in the first embodiment, the FPC 10 in the second embodiment, or the FPC 10 in the third embodiment may also be used.

Further, in the method of manufacturing the ultrasonic probe 1 in the embodiment of the invention, while the FPC 10 is interposed in the backing material 100, which is then cut, this is not restrictive but the FPC 10 may be cut and then interposed in the backing material 100.

Further, in FIG. 4(a) showing the FPC 10 in the third embodiment of the invention, while the distance between each of the plural wiring patterns 30 is narrowed continuously along the extending direction of the FPC 10, this is not restrictive but it may be narrowed stepwise.

Further, in FIG. 4(b) showing the FPC 10 in the fourth embodiment of the invention, while the distance between each of the plural wiring patterns 30 is narrowed stepwise along the extending direction of the FPC 10, this is not restrictive but this may be narrowed continuously.

Further, in the third embodiment or the fourth embodiment of the invention, the mark formed at the surface of the FPC 10 along the extending direction of the FPC 10 is a scale indicative of the length in the extending direction of FPC 10 or a wiring pattern for measuring the resistance value for recognizing the length of the FPC 10 in the extending direction, this is not restrictive but it may be a numerical value showing the distance between each of the plural wiring patterns 30.

Many widely different embodiments of the invention may be configured without departing from the spirit and the scope of the present invention. It should be understood that the present invention is not limited to the specific embodiments described in the specification, except as defined in the appended claims.

The invention claimed is:

1. A method of manufacturing an ultrasonic probe having: plural arranged ultrasonic transducers; and a flexible printed circuit board in which plural wiring patterns to be connected with the plural ultrasonic transducers are arranged on the surface of an electrically insulative substrate being spaced along the arranging direction of the plural ultrasonic transducers, the method comprising:

a cutting step for cutting the flexible printed circuit board, wherein:

the flexible printed circuit board used in the cutting step includes a portion where the substrate extends in the direction different from the arranging direction of the plural ultrasonic transducers, wherein the plural wiring patterns extend such that a distance between each of the plural wiring patterns is narrowed along the extending direction of the substrate; and the flexible printed circuit board is cut in the cutting step such that the arranging positions for the plural ultrasonic transducers and the positions for the plural wiring patterns in the flexible printed circuit board correspond to each other, wherein the flexible printed circuit board is cut in accordance with a resistance value of the plural wiring patterns.

2. The method of manufacturing an ultrasonic probe according to claim 1, wherein the plural wiring patterns in the flexible printed circuit board extend such that the distance is narrowed continuously along the extending direction of the substrate.

3. A method of manufacturing an ultrasonic probe according to claim 1, wherein the plural wiring patterns in the flexible printed circuit board extend such that the distance is narrowed stepwise along the extending direction of the substrate.

4. The method of manufacturing an ultrasonic probe according to claim 1, wherein the flexible printed circuit board is cut in accordance with a mark attached to the flexible printed circuit board along the flexible printed circuit board, wherein the mark is a scale indicative of the length in the extending direction of the substrate.

5. The method of manufacturing an ultrasonic probe according to claim 1, further comprising measuring the resistance value of the plural wiring patterns.

6. The method of manufacturing an ultrasonic probe according to claim 1, including the steps of:

before the cutting step, interposing the flexible printed circuit board in a backing material so as to include the positions for the plural wiring patterns corresponding to the arranged positions for the plural ultrasonic transducers in the flexible printed circuit board; and cutting the flexible printed circuit board and the backing material interposing the flexible printed circuit board therein simultaneously in the cutting step.

7. The method of manufacturing an ultrasonic probe according to claim 6, wherein an acoustic impedance of the backing material is from $2 \times 5^2$ g/(cm$^2$·sec) to $10 \times 10^5$ g/(cm$^2$·sec).

8. A method of manufacturing an ultrasonic probe having: plural arranged ultrasonic transducers; and a flexible printed circuit board in which plural wiring patterns to be connected with the plural ultrasonic transducers are arranged on the surface of an electrically insulative substrate being spaced along the arranging direction of the plural ultrasonic transducers, the method comprising:

interposing the flexible printed circuit board in a backing material so as to include the positions for the plural wiring patterns corresponding to the arranged positions for the plural ultrasonic transducers in the flexible printed circuit board; and simultaneously cutting the flexible printed circuit board and the backing material, wherein the flexible printed circuit board includes a portion where the substrate extends in the direction different from the arranging direction of the plural ultrasonic transducers, wherein the plural wiring patterns extend such that a distance between each of the plural wiring patterns is narrowed along the extending direction of the substrate, and the flexible printed circuit board is cut such that the arranging positions for the plural ultrasonic transducers and the positions for the plural wiring patterns in the flexible printed circuit board correspond to each other.

9. The method of manufacturing an ultrasonic probe according to claim 8, wherein the plural wiring patterns in the flexible printed circuit board extend such that the distance is narrowed continuously along the extending direction of the substrate.

10. The method of manufacturing an ultrasonic probe according to claim 8, wherein the flexible printed circuit board is cut in accordance with a mark attached to the flexible printed circuit board along the flexible printed circuit board, wherein the mark is a scale indicative of the length in the extending direction of the substrate.

11. The method of manufacturing an ultrasonic probe according to claim 8 further comprising measuring a resistance value of the plural wiring patterns, wherein the flexible printed circuit board is cut in accordance with the resistance value.

12. The method of manufacturing an ultrasonic probe according to claim 8, wherein an acoustic impedance of the backing material is from $2 \times 5^2$ g/(cm$^2$·sec) to $10 \times 10^5$ g/(cm$^2$·sec).

* * * * *